(12) United States Patent
Julian

(10) Patent No.: US 11,455,816 B2
(45) Date of Patent: Sep. 27, 2022

(54) FINGERPRINT SENSOR MODULE COMPRISING A FINGERPRINT SENSOR DEVICE AND A SUBSTRATE CONNECTED TO THE SENSOR DEVICE

(71) Applicant: Fingerprint Cards AB, Gothenburg (SE)

(72) Inventor: Rogelio Julian, Sta Rosa (PH)

(73) Assignee: FINGERPRINT CARDS ANACATUM IP AB, Gothenburg (SE)

( * ) Notice: Subject to any disclaimer, the term of this patent is extended or adjusted under 35 U.S.C. 154(b) by 395 days.

(21) Appl. No.: 16/491,468

(22) PCT Filed: Mar. 6, 2018

(86) PCT No.: PCT/SE2018/050211
§ 371 (c)(1),
(2) Date: Sep. 5, 2019

(87) PCT Pub. No.: WO2018/164628
PCT Pub. Date: Sep. 13, 2018

(65) Prior Publication Data
US 2020/0034594 A1    Jan. 30, 2020

(30) Foreign Application Priority Data
Mar. 10, 2017 (SE) .................................. 1750279-0

(51) Int. Cl.
*G06V 40/13* (2022.01)
*H01L 23/12* (2006.01)
*H01L 23/31* (2006.01)

(52) U.S. Cl.
CPC ...... *G06V 40/1306* (2022.01); *G06V 40/1329* (2022.01); *H01L 23/12* (2013.01); *H01L 23/31* (2013.01)

(58) Field of Classification Search
CPC .. G06K 9/0002; G06K 9/00053; H01L 23/12; H01L 23/31; G06V 40/1306; G06V 40/1329
See application file for complete search history.

(56) References Cited

U.S. PATENT DOCUMENTS

2006/0083411 A1* 4/2006 Benkley, III ....... G06K 9/00053
                                                        382/124
2013/0307818 A1  11/2013  Pope et al.
(Continued)

FOREIGN PATENT DOCUMENTS

CN      105095861 A    11/2015
CN      105321895 A     2/2016

OTHER PUBLICATIONS

PCT International Search Report and Written Opinion dated May 18, 2018 for International Application No. PCT/SE2018/050211, 11 pages.
(Continued)

*Primary Examiner* — Premal R Patel
(74) *Attorney, Agent, or Firm* — RMCK Law Group, PLC

(57) ABSTRACT

There is provided a fingerprint sensor module comprising: a fingerprint sensor device comprising a plurality of sensing elements for acquiring an image of a finger placed on a sensing surface of the sensor module. The sensor device comprises a trench at an edge of the fingerprint sensor device, the trench comprising electrically conductive connection pads for connecting the sensor device to external circuitry. The module further comprises a substrate comprising an electrically conductive trace and an electric component arranged on the substrate and in electrical contact with the conductive trace. The substrate is electrically and mechanically connected to the edge trench such that an electrical connection is formed between the sensor device (Continued)

and the electrical component of the substrate via the conductive trace. There is also provided a method for manufacturing the described module.

16 Claims, 7 Drawing Sheets

(56) References Cited

U.S. PATENT DOCUMENTS

| | | | |
|---|---|---|---|
| 2015/0177884 A1* | 6/2015 | Han | G06F 3/04166 345/174 |
| 2015/0189204 A1 | 7/2015 | Oganesian et al. | |
| 2016/0140379 A1 | 5/2016 | Pedersen | |
| 2016/0210495 A1 | 7/2016 | Jägemalm et al. | |
| 2016/0211233 A1* | 7/2016 | Yiu | H01L 24/02 |
| 2016/0314334 A1* | 10/2016 | He | G06K 9/0002 |
| 2016/0321442 A1 | 11/2016 | Song et al. | |
| 2016/0364592 A1 | 12/2016 | Lin | |

OTHER PUBLICATIONS

Extended European Search Report dated Nov. 26, 2020 for European Patent Application No. 18763436.5, 8 pages.

* cited by examiner

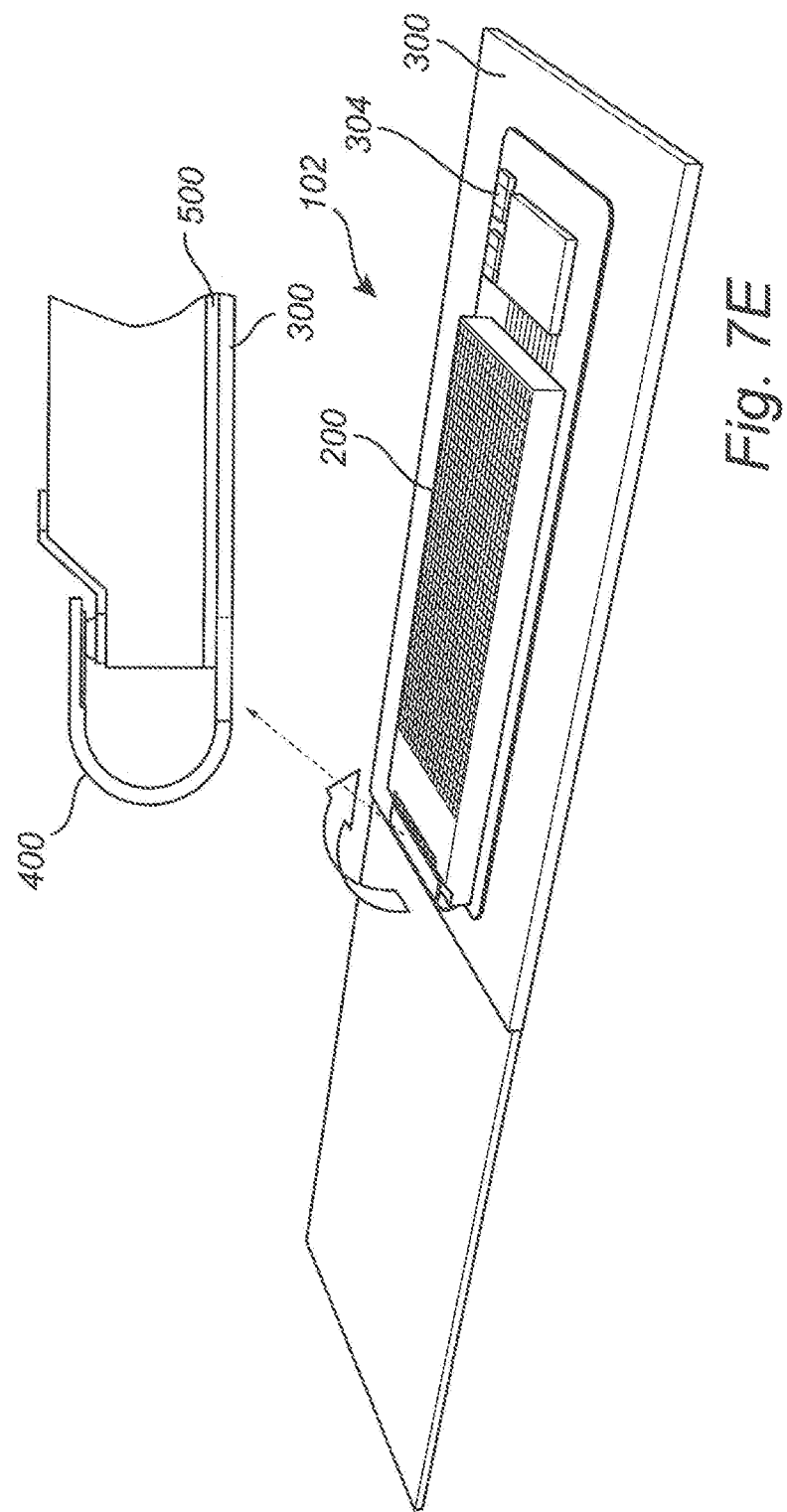

FINGERPRINT SENSOR MODULE COMPRISING A FINGERPRINT SENSOR DEVICE AND A SUBSTRATE CONNECTED TO THE SENSOR DEVICE

CROSS-REFERENCE TO RELATED APPLICATIONS

This application is a 371 U.S. National Stage of International Application No. PCT/SE2018/050211, filed Mar. 6, 2018, which claims priority to Swedish Patent Application No. 1750279-0, filed Mar. 10, 2017. The disclosures of each of the above applications are incorporated herein by reference in their entirety.

FIELD OF THE INVENTION

The present invention relates to a fingerprint sensor module and to a method for manufacturing a fingerprint sensor module comprising a fingerprint sensor device and a substrate connected to the sensor device.

BACKGROUND OF THE INVENTION

As the development of biometric devices for identity verification, and in particular of fingerprint sensing devices, has lead to devices which are made smaller, cheaper and more energy efficient, the possible applications for such devices are increasing. Fingerprint sensing in particular has been adopted in more and more applications such as consumer electronic devices and smart cards due to small form factor, relatively beneficial cost/performance factor and high user acceptance.

Capacitive fingerprint sensing devices, built based on CMOS technology for providing the fingerprint sensing elements and auxiliary logic circuitry, are increasingly popular as such sensing devices can be made both small and energy efficient while being able to identify a fingerprint with high accuracy. Thereby, capacitive fingerprint sensors are advantageously used for consumer electronics, such as portable computers, tablet computers and mobile phones, e.g. smartphones.

A fingerprint sensing chip typically comprises an array of capacitive sensing elements providing a measure indicative of the capacitance between several sensing structures and a finger placed on the surface of the fingerprint sensor. The sensing chip may further comprise logic circuitry for handling addressing of the array of sensing elements.

Furthermore, the sensing chip is often mounted on a separate substrate comprising circuitry associated with the fingerprint sensor, wherein contact pads of the sensing chip are provided for enabling an electrical connection by means of wire-bonding to corresponding contact pads of the substrate. The substrate may for example be a printed circuit board (PCB) or any other type of substrate.

However, a wire bond protrudes above the surface of the sensing chip with a distance corresponding to the height of the bond plus the curvature of the bond-wire, commonly referred to as the wire bond loop height. Accordingly, protruding wire bonds introduce constraints in the assembly and design of a fingerprint sensor. In particular, in many applications is it desirable to provide a fingerprint sensing device which is flat, both for aesthetic reasons and as elevated portions of a sensing surface may lead to that a finger is partially lifted near the protruding portion.

In order to achieve a flat sensing surface, it is possible to provide a layer of top coating which is sufficiently thick so that the protruding wire bond is covered, thereby forming a flat outer surface. However, a thicker coating result in a weaker capacitive coupling between a finger placed on the surface and a sensing element located under the coating, which leads to a reduced accuracy of the sensing device.

Another solution would be to connect the fingerprint sensor device to the substrate by means of through-silicon-via connections (TSVs) which does not add an extra layer of material on top of the pixels but where the manufacturing process instead is complicated, making it expensive and difficult to optimize. In addition, using the TSV solution requires thin silicon, making the TSV package more prone to package warpage.

Accordingly, it is desirable to provide an improved fingerprint sensor module facilitating an improved connection of the fingerprint sensor device to a substrate.

SUMMARY

In view of above-mentioned and other drawbacks of the prior art, it is an object of the present invention to provide a fingerprint sensing module providing an improved connection of the fingerprint sensing device to a substrate.

According to a first aspect of the invention, there is provided a fingerprint sensor module comprising: a fingerprint sensor device comprising a plurality of sensing elements for acquiring an image of a finger placed on a sensing surface of the sensor module, the sensor device comprising at least one trench at an edge of the fingerprint sensor device, the trench comprising electrically conductive connection pads for connecting the sensor device to external circuitry; and a substrate comprising an electrically conductive trace and an electric component arranged on the substrate and in electrical contact with the conductive trace, wherein a first side of the substrate is electrically and mechanically connected to the edge trench such that an electrical connection is formed between the sensor device and the electrical component of the substrate via the conductive trace.

The fingerprint sensing device is a component which is configured to acquire an image of a finger placed on a sensing surface of the fingerprint sensing module, such that a fingerprint can be derived from the image. Each sensing element of the fingerprint sensor device can be seen as a pixel such that the resolution of sensing elements corresponds to the resolution of the acquired image. The sensing element may for example comprise an electrically conductive structure configured to form a capacitive coupling between the conductive structure and a finger placed on the sensing surface. The fingerprint sensor device is typically a semiconductor device which also may be referred to as a chip, a die or the like. Even though the present disclosure is primarily aimed at a capacitive fingerprint sensor device, various embodiments of the invention are equally applicable to other types of fingerprint sensors, such as ultrasonic sensors and/or optical sensors The sensing elements are typically arranged in a square or rectangular array in a surface plane of the fingerprint sensor device. Note that this surface plane is typically not the same as the sensing surface of the fingerprint sensing module, since one or more layers of material are typically used to cover and protect the sensing elements from physical wear and tear. The sensing surface may for example be a glass or quartz plate covering the fingerprint sensor module, or a display glass of a device such as a smart phone.

The edge trench should in the present context be seen as a portion or region of the fingerprint sensor, located at an edge of the fingerprint sensor, and which is recessed in relation to the surface plane of the fingerprint sensor defined by the sensing elements.

The substrate which connects to the edge trench may be used for facilitating mounting the fingerprint sensor module in an electronic device, for connecting the fingerprint sensor device to external circuitry and for carrying additional components associated with the operation of the fingerprint sensor device.

The present invention is based on the realization that a fingerprint sensor module without wire bonds from the sensor device to a substrate can be provided by attaching the substrate directly to the fingerprint sensor device and by forming an electrical connection directly between connection pads in the trench and conductive traces of the substrate. Thereby, the distance between the sensing elements and the sensing surface can be minimized without having to take bond wire loops into account. The described arrangement of the sensor device and the substrate can be likened with a flip-chip methodology, as will be described in further detail in the description. Moreover, the described fingerprint sensor module can be manufactured at a lower cost compared to a module comprising via connections due to the simplified assembly flow. A further advantage is achieved since the stack-up of the sensor device is simplified, thereby reducing warpage of the fingerprint sensor device. Additionally, since no connections are formed on the backside of the fingerprint sensor device, the final thickness of the sensor device, and thereby of the overall sensor module, can be easily adjusted by means of back-grinding.

According to one embodiment of the invention, the trench may extend along the entire length of a side on the fingerprint sensor device, thereby providing the maximum possible area for connecting the substrate, potentially providing an improved adhesion between the substrate and the fingerprint sensor device.

According to one embodiment of the invention, the trench may extend along part of the length of a side on the fingerprint sensor device. This may for example simplify alignment of the substrate in relation to the sensor device when joining the two components together. The trench may comprise a plurality of individual recessed portions which are separate from each other, or the trench may comprise a single trench defined by sidewalls. A trench which does not span the entire length of the fingerprint sensor may facilitate accurate alignment of the substrate in relation to the sensor device.

According to one embodiment of the invention, the electrical component may advantageously be attached to the side of the substrate which is connected to the trench of the fingerprint sensor device. Since one of the advantages of the present invention related to the decreased distance between the fingerprint sensor and a sensor surface, it is advantageous to arrange any additional electrical components on the substrate on the same side that is connected to the trench, in order to avoid components protruding above the surface plane defined by the sensing elements.

According to one embodiment of the invention, the conductive trace may be embedded in the substrate, thereby protecting the conductive trace. The conductive trace exposed at the locations where it connects to the conductive pads.

According to one embodiment of the invention, the substrate may comprise a plurality of separate embedded conductive layers, thereby enabling more complexity in the connections formed by means of the substrate and also connections between the respective layers. Alternatively, or in combination, the substrate may also comprise conductive traces arranged on a surface of the substrate.

According to one embodiment of the invention, the substrate may be a flexible substrate which facilitates additional configurations of the fingerprint sensor module. For example, in one embodiment of the invention, the flexible substrate may be bent such that the fingerprint sensor device is arranged in contact with the first side of the substrate. The fingerprint sensor device can thereby be said to be arranged on the substrate and at the same time being electrically connected to the substrate at the trench. Moreover, the bend may be located adjacent to the trench of the sensor device such that the footprint area of the fingerprint sensor module can be made to be only slightly larger that the area of the fingerprint sensor module. The fingerprint sensor device can be attached to the substrate using an adhesive such as an adhesive film r a liquid adhesive.

According to one embodiment of the invention a thickness of substrate is advantageously lower than a depth of the trench. Thereby, the substrate does not protrude above a surface plane defined by the sensing elements, ensuring that the distance between the sensing elements and a sensing surface of the fingerprint sensor module can be minimized.

According to a second aspect of the invention, there is provided a method for manufacturing a fingerprint sensing module. The method comprises: providing a fingerprint sensor device comprising a plurality of sensing elements for acquiring an image of a finger placed on a sensing surface of the sensor module; forming an edge trench in the fingerprint sensor device; forming an electrical connection between the sensor surface and the edge trench; providing a substrate comprising an electrically conductive trace and an electric component arranged on the substrate and in electrical contact with the conductive trace, arranging a first side of the substrate in electrical and mechanical contact with the edge trench to form an electrical connection between the sensor device and the electric component of the substrate.

According to one embodiment of the invention, arranging the substrate in contact with the edge trench of the fingerprint sensing device may comprise using a flip-chip method wherein the fingerprint sensing device is flipped and placed such that the trench is arranged in contact with the substrate. Thereby, existing flip-chip manufacturing equipment can be used to form the fingerprint sensor module.

According to one embodiment of the invention the method may further comprise: providing a carrier comprising a step defining a difference in height between a lower portion and an upper portion of the carrier; arranging the substrate on the upper portion of the step; and arranging the sensor device on the lower portion of the step such that the edge trench is in contact with the substrate and such that at least a portion of the fingerprint sensor device rests on the lower portion of the carrier. The described carrier simplifies the step of attaching the sensor device to the substrate in that the sensor device can be placed on the lower portion of the carrier with the trench being at the correct height for connecting to the substrate which is located at the upper portion of the carrier. Preferably, the height of the step is such that the step height plus the substrate thickness is equal to the depth of the trench. In a special case where the thickness of the substrate is equal to the depth of the trench, there would not be a need for a step in the carrier.

According to one embodiment of the invention where the substrate is a flexible substrate, the method may further comprise folding the substrate such that the first side of the substrate makes contact with a side of the fingerprint sensor device opposite the side comprising the plurality of sensing elements.

Additional effects and features of the second aspect of the invention are largely analogous to those described above in connection with the first aspect of the invention.

Further features of, and advantages with, the present invention will become apparent when studying the appended claims and the following description. The skilled person realize that different features of the present invention may be combined to create embodiments other than those described in the following, without departing from the scope of the present invention.

BRIEF DESCRIPTION OF THE DRAWINGS

These and other aspects of the present invention will now be described in more detail, with reference to the appended drawings showing an example embodiment of the invention, wherein:

FIGS. 7A-E schematically illustrate steps of a method according to an embodiment of the invention.

DETAILED DESCRIPTION OF EXAMPLE EMBODIMENTS

In the present detailed description, various embodiments of the sensor module and method according to the present invention will be described. Embodiments of the present invention are mainly described with reference to a capacitive fingerprint sensing device arranged in a smartphone. However, it should be noted that the present invention is applicable for any type of fingerprint sensor. The fingerprint sensor device may for example be an active or passive capacitive device, an ultrasonic or an optical device.

Figure 1:
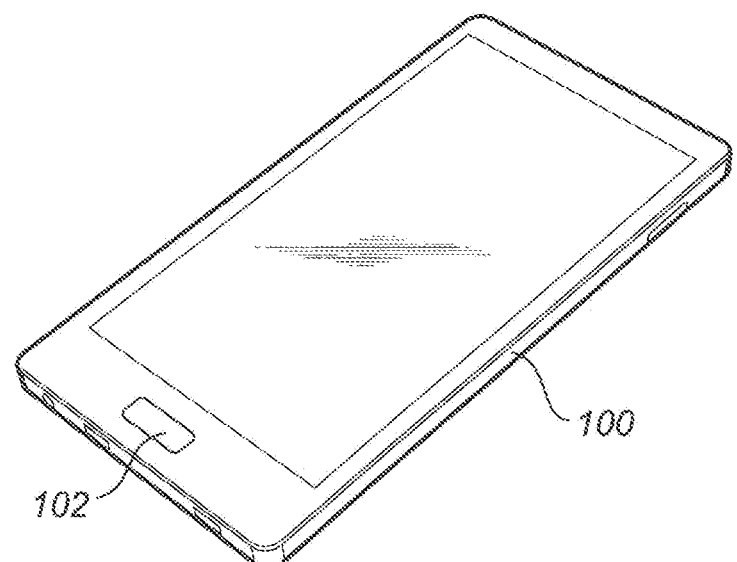
FIG. 1 schematically illustrates an electronic device comprising a fingerprint sensor module according to embodiments of the invention.

FIG. 1 schematically illustrates a smartphone 100 comprising a fingerprint sensor module 102 according to an example embodiment of the present invention. The fingerprint sensor module 102 may, for example, be used for unlocking the smartphone 100 and/or for authorizing transactions carried out using the smartphone. A fingerprint sensing module according to various embodiments of the invention may also be used in other electronic devices, such as tablet computers, laptops, or other types of consumer electronics. The described fingerprint sensing device may also be used in applications such as smartcards, vehicles etc.

Figure 2:
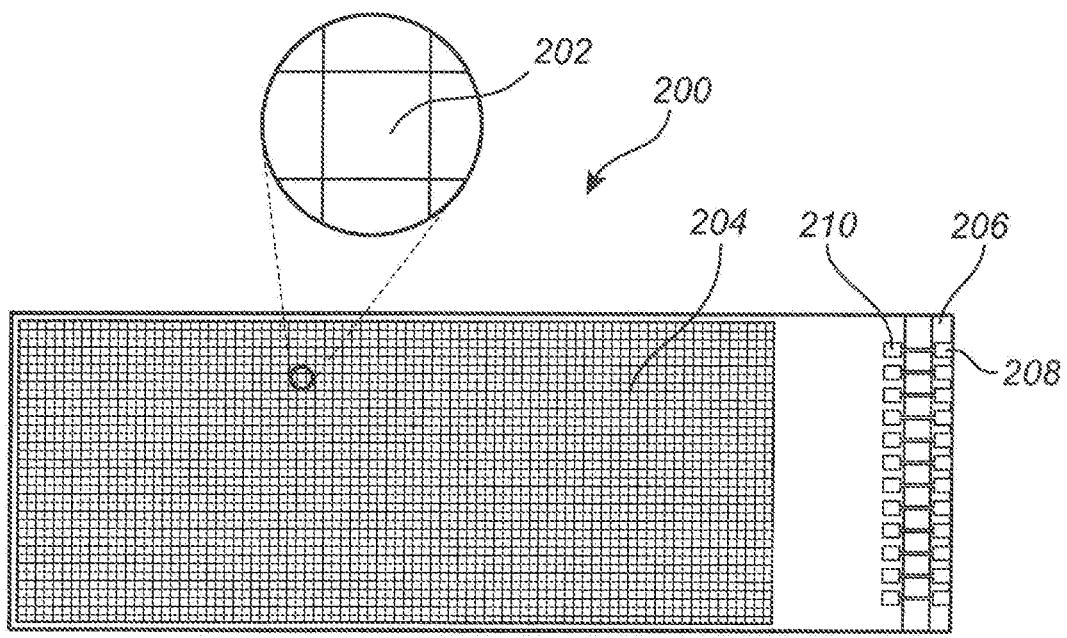
FIG. 2 schematically illustrates a fingerprint sensor device used in embodiments of the invention.

FIG. 2 schematically shows a top view of the fingerprint sensor device 200 comprised in the fingerprint sensor module 102 in FIG. 1. The fingerprint sensor device 200 may also be referred to as a fingerprint sensor chip or die, and is typically formed from a silicon substrate. As can be seen in FIG. 2, the fingerprint sensor device 200 comprises a plurality of sensing elements 202 arranged in a sensor array 204. The sensor array 204 comprises a large number of individual sensing elements 202, each being controllable to sense a distance between an electrically conductive sensing structure comprised in the sensing element 202 and the surface of a finger contacting the top surface of the fingerprint sensing module 102, or another surface defined as the sensing surface. The fingerprint sensor module 102 may for example be arranged underneath a display glass or other cover glass of an electronic device. The electrically conductive sensing structure of the sensing element 202 is typically an electrically conductive plate. The general functionality of a fingerprint sensor is well known to the skilled person and will not be discussed in further detail herein.

FIG. 2 further shows a trench 206 at an edge of the fingerprint sensor device 200, and the trench 206 comprises electrically conductive connection pads 208 for connecting the sensor device to external circuitry. The connection pads 208 of the trench is in turn connected to corresponding connection pads 210 on the surface of the fingerprint sensor device 200 by means of conductive traces. The connection pads 210 on the surface of the fingerprint sensor device 200 are located in the same plane as the sensing structures of the sensing elements 202. Even though the trench 206 is illustrated as being located at one edge of the fingerprint sensor device 200, the fingerprint sensor device 200 may in principle comprise a plurality of edge trenches located on several different sides of the device 200.

Moreover, in FIG. 2, the trench 206 extends along the entire length of the side of the fingerprint sensor device 200. However, it is equally possible that the trench 206 extends along only a part of the length of the side. The size of the trench 206 may for example be adapted to the size of the substrate to be connected.

Figure 3A:
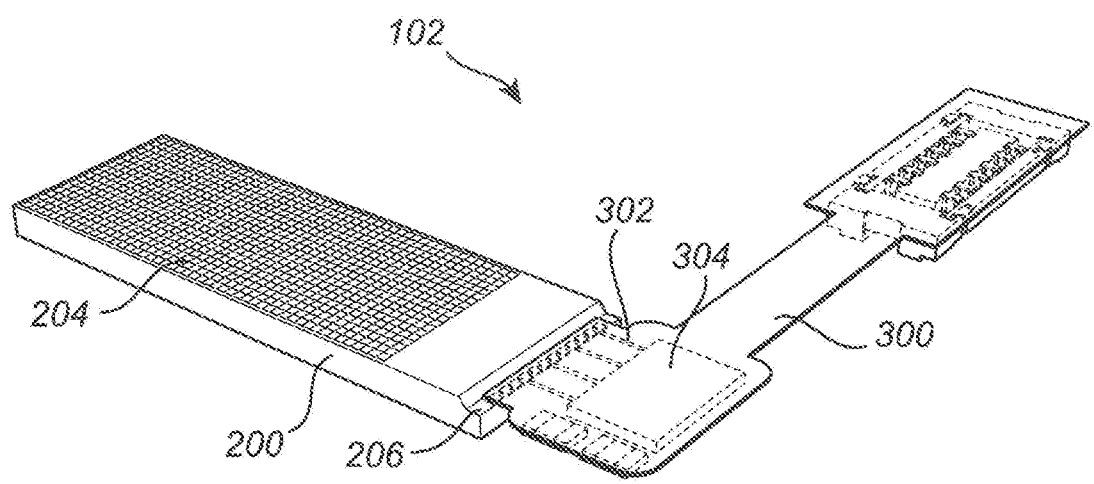
FIGS. 3A-B schematically illustrate a fingerprint sensor module according to embodiments of the invention.
Figure 3B:
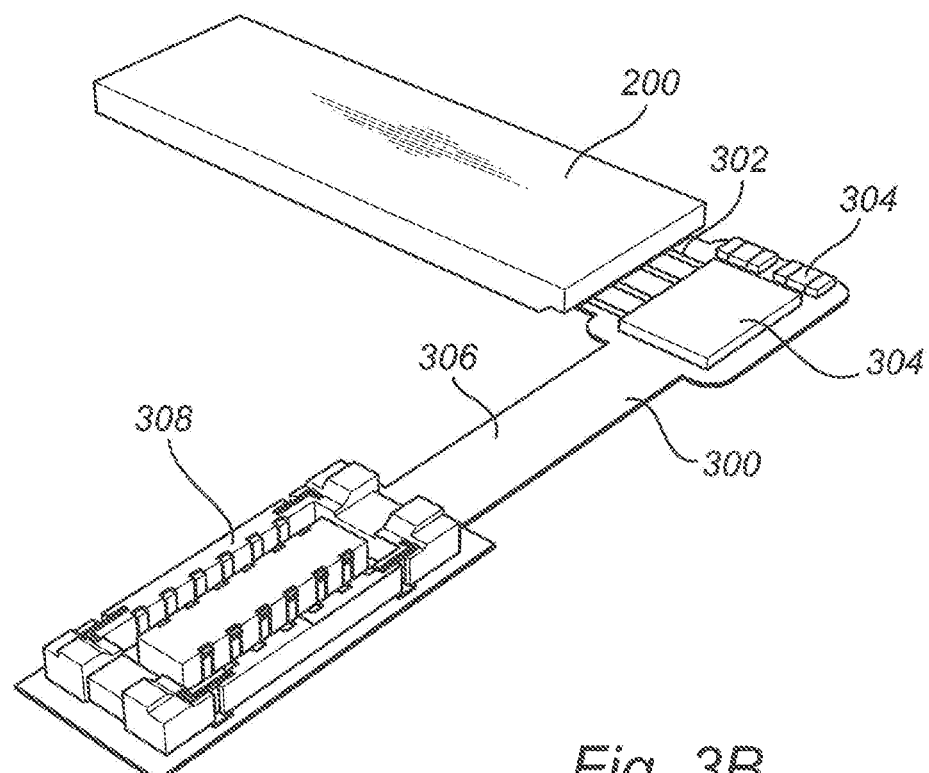

FIGS. 3A-B schematically illustrate a fingerprint sensor module 102 connected to a substrate 300 comprising an electrically conductive trace 302 and electric components 304 arranged thereon. A first side 306 of the substrate 300 is electrically and mechanically connected to the edge trench 206 of the fingerprint sensor device 200 such that an electrical connection is formed between the sensor device 200 and the electrical components 304 of the substrate 300 via the conductive traces 302.

Here, the electrical components 304 are attached to the same side of the substrate 300 which is connected to the trench 206 of the fingerprint sensor device 200. Thereby, no parts of the substrate 300 or of components 304 arranged thereon protrude above the surface of the fingerprint sensor device 200. The substrate 300 also comprises a connector 308 for connecting the fingerprint sensor module 102 to an external device, such as a smartphone.

In FIGS. 3A-B, the conductive traces 302 of the substrate 300 forming the connection between the connection pads 208 of the trench 206 and the electric components 304 of the substrate 300 are located on the surface of the substrate 300. However, the conductive traces 302 may equally well be embedded within the substrate 300 and exposed only at the points of connection, so as to protect the conductive traces 302. The substrate 300 may also comprise several separate layers of conductive traces 302, thereby providing additional connection possibilities. The electric components 304 may comprise both active and passive electric components.

Figure 4:
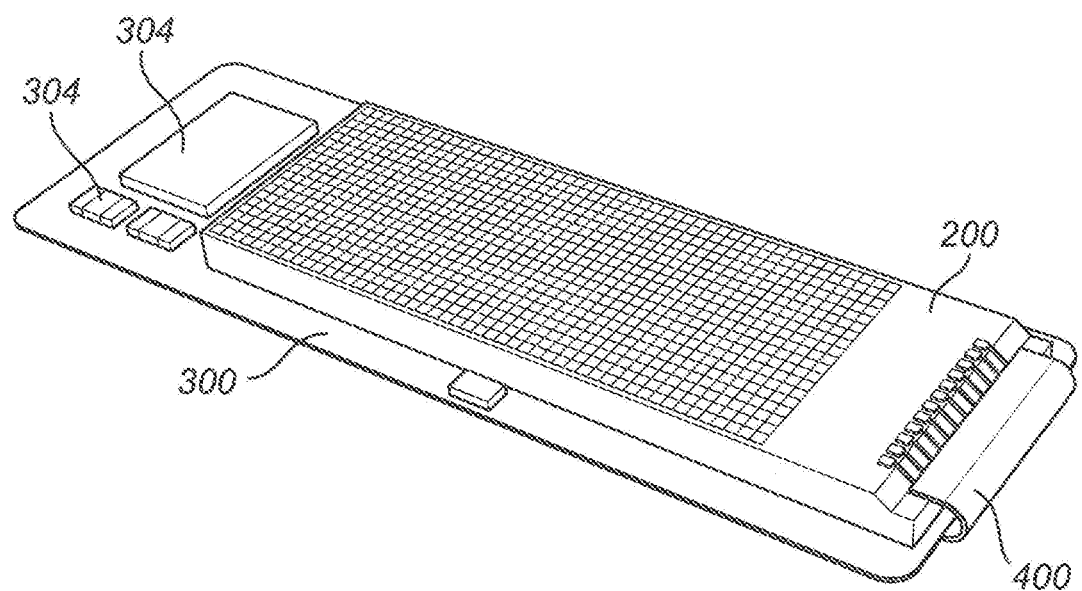
FIG. 4 schematically illustrates a fingerprint sensor module according to an embodiment of the invention.

FIG. 4 illustrates an embodiment of the fingerprint sensor module 102 where the substrate 300 is a flexible substrate 300. As illustrated in FIG. 4, and in further detail in FIG. 5, the substrate 300 has been bent and folded in under the fingerprint sensor device 200, thereby significantly reducing the overall footprint area of the fingerprint sensor module 102. The substrate 300 may thus be a flexible substrate. However, it is sufficient that the curved portion 400 of the substrate 300 is flexible to achieve the embodiment illustrated in FIG. 4.

Figure 5:
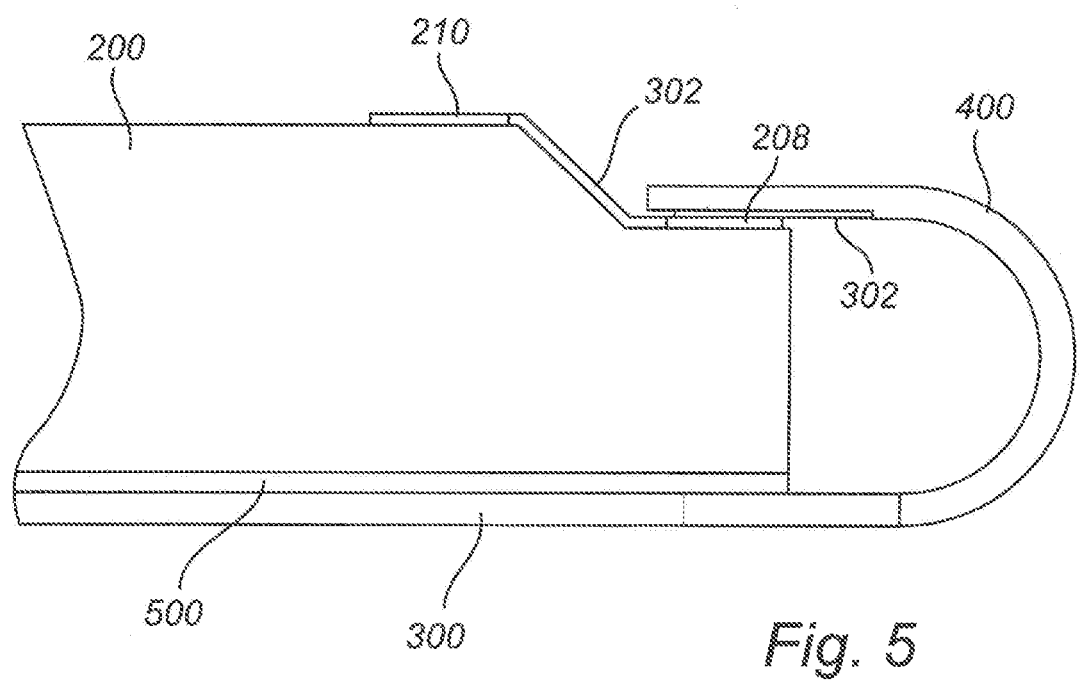
FIG. 5 schematically illustrates a fingerprint sensor module according to an embodiment of the invention.

FIG. 5 schematically illustrates details of the connection between the substrate 300 and the fingerprint sensor device 200. In FIG. 5, it can be seen how the connection pad 210 of the fingerprint sensor device is connected to the connection pad 208 of the trench 206. The curved portion 400 of the substrate is flexible so that it can be bent to a U-shape, and the substrate 300 is attached to the fingerprint sensor device 200 by means of an adhesive layer 500. It is also illustrated that the combined thickness of the substrate 300 and the connection pad 208 of the trench 206 is lower than or equal to the depth of the trench 206 so that no part of the substrate 306 protrudes above the surface of the fingerprint sensor device 200.

Moreover, the transition between the top surface of the fingerprint sensor device 200 and the trench 206 is sloped to facilitate formation of the conductive traces 302 between the upper surface and the bottom of the trench. In an example application, the thickness of the substrate 300 is approximately 50 μm and the depth of the trench 206 is in the range of 100-150 μm.

Figure 6:
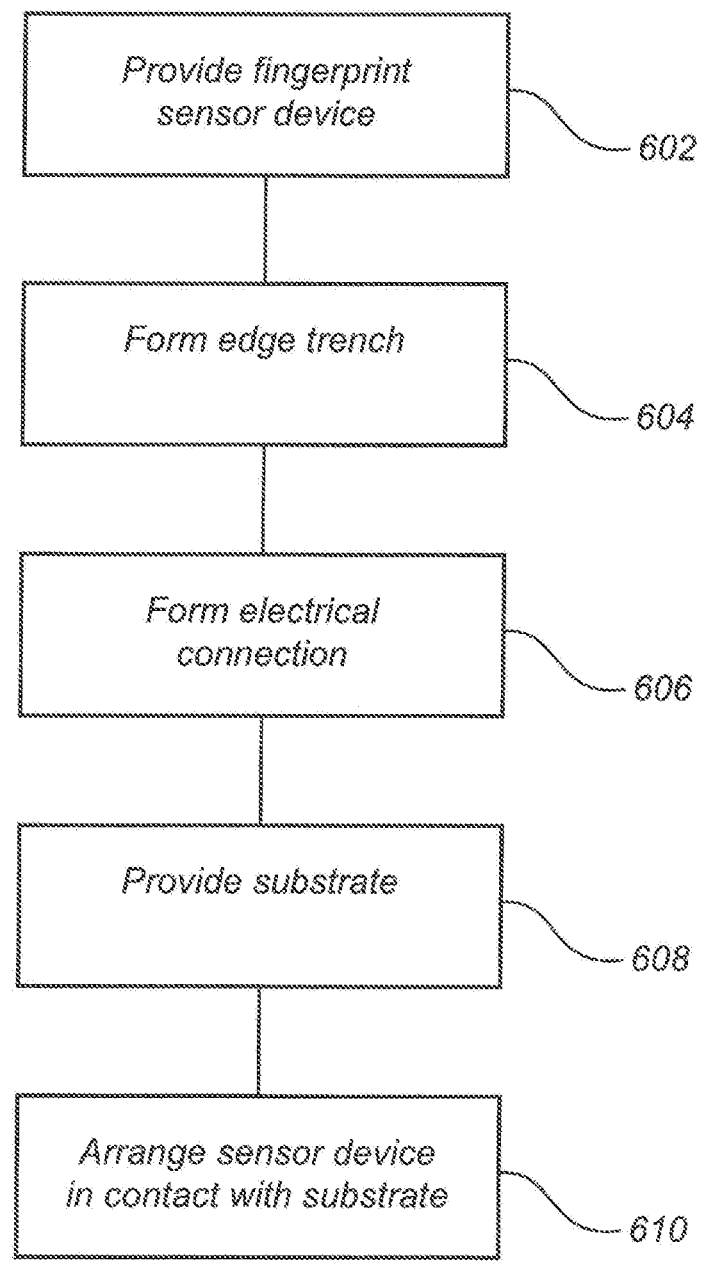
FIG. 6 is a flow chart outlining general steps of a method for manufacturing a fingerprint sensor module according to an embodiment of the invention.

FIG. 6 is a flow chart outlining the general steps of a method form manufacturing a fingerprint sensor module 102 according to an embodiment of the invention. The method will be described with further reference to FIG. 7A-E schematically illustrating selected steps of the method.

Figure 7A:
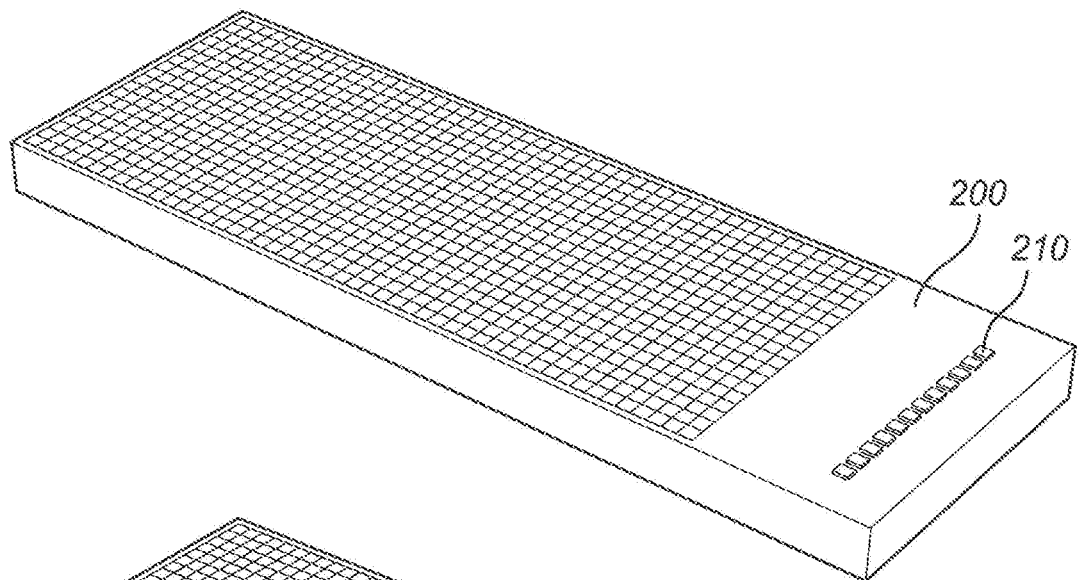

First, a fingerprint sensor device 200 comprising a plurality of sensing elements 202 is provided 302, illustrated in FIG. 7A. The provided fingerprint sensor device 200 comprises connection pads 210 which are typically formed in the same metal layer as the top sensing structure of the sensing elements 202.

Figure 7B:
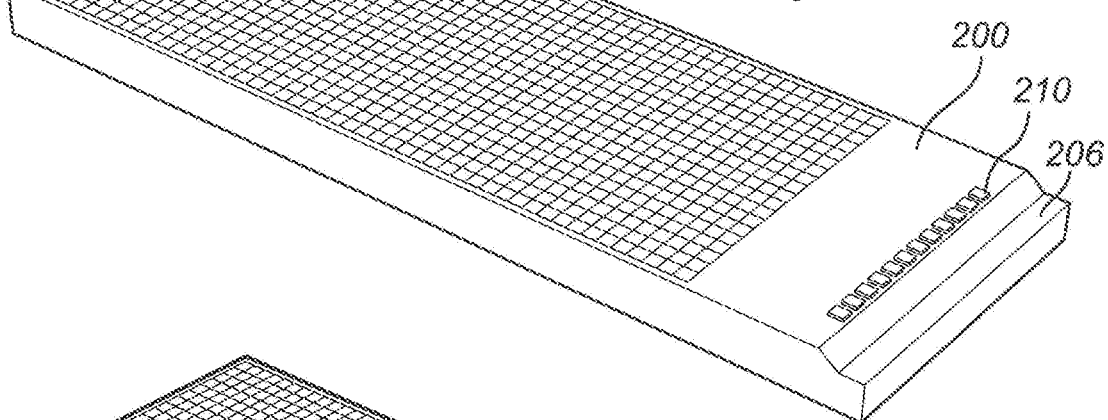

Next, an edge trench 206 is formed 604 as illustrated in FIG. 7B. The edge trench may be formed by deep reactive ion etching, DRIE, in a process adapted to form a sloped transition between the top surface of the fingerprint sensor device 200 and the bottom of the trench 206.

Figure 7C:
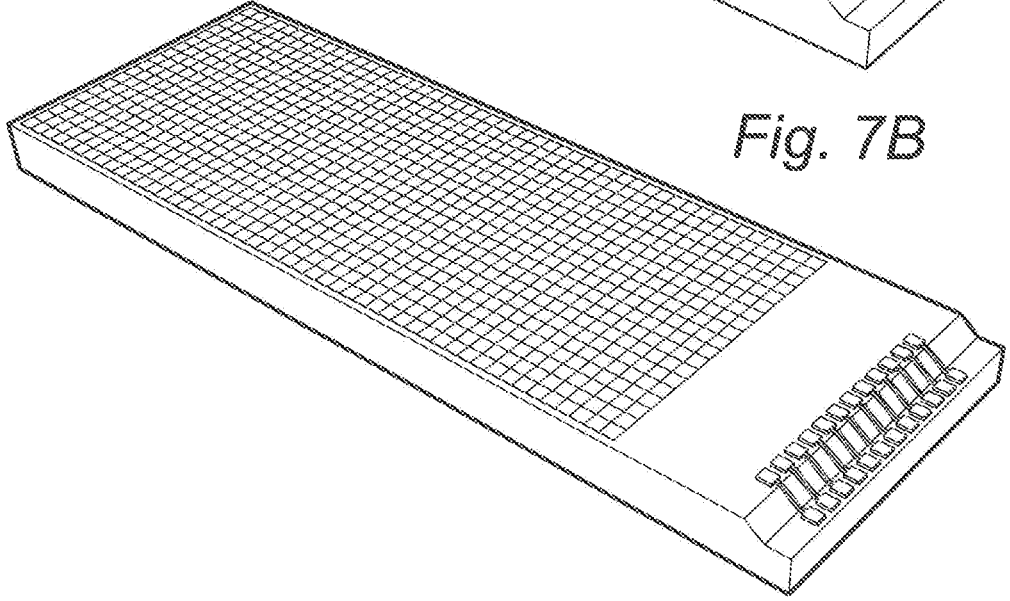

Once the edge trench 206 is formed, an electrical connection between the sensor surface and the edge trench 206 is formed 606 along with contact pads 208 in the trench for subsequent connection to a substrate. The electrical connections are illustrated in FIG. 7C. The illustrated electrical connections traversing the slope may for example be formed by deposition of an electrically conductive redistribution layer (RDL) and subsequent patterning.

In the following step, a substrate 300 is provided 608 comprising an electrically conductive trace 302 and at least one electric component 304 arranged on the substrate 300 and in electrical contact with the conductive trace 302.

Figure 7D:
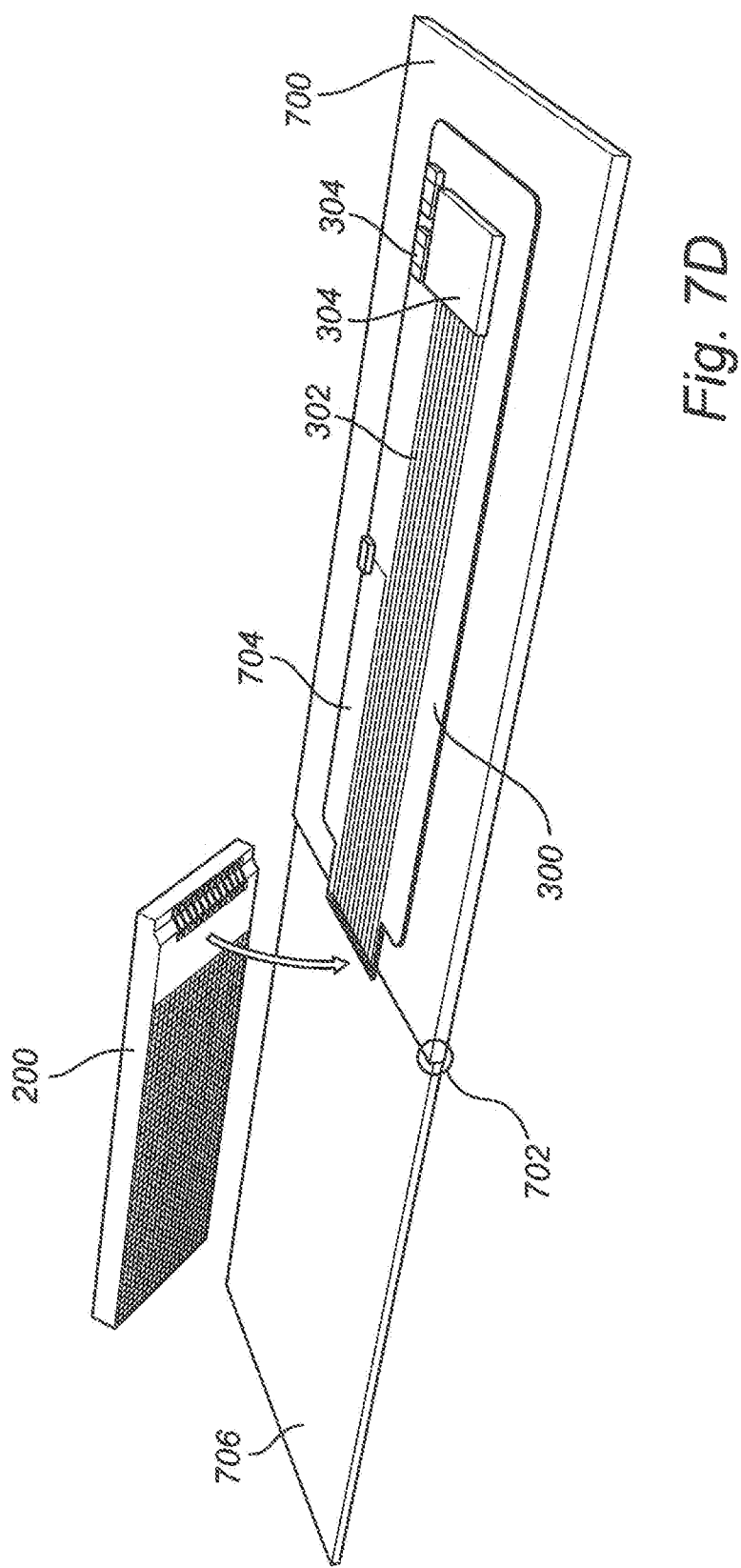

To form the final fingerprint sensor module, the first side of the substrate is arranged 610 in electrical and mechanical contact with the edge trench 206 to form an electrical connection between the fingerprint sensor device 200 and the electric components 304 of the substrate 300. Arranging the substrate 300 in contact with the edge trench 206 of the fingerprint sensor device may comprise using a flip-chip method as illustrated in FIG. 7D. In the flip-chip method, the fingerprint sensor device 200 is flipped "upside down" and placed such that the trench 206 is arranged in contact with the substrate 300.

In order to facilitate the flip-chip process, a carrier 700 comprising a step 702 can be used. The carrier 700 comprising the step 702 is illustrated in FIG. 7D. The step 702 defines a difference in height between an upper portion 704 of the carrier surface and a lower portion 706 of carrier surface. It should be noted that the carrier may be adapted to carry a large number of substrates 300 to enable a parallel mounting process. The substrate 300 is arranged on the upper portion 704 of the step 702 with the exposed end portions of the conductive traces 302 located adjacent to the step 702 of the carrier 700. Next, the fingerprint sensor device 200 is arranged on the lower portion 706 of the carrier adjacent to the step 702 such that the edge trench 206 is in contact with the substrate 300 and such that at least a portion of the fingerprint sensor device rests on the lower portion 706 of the carrier 700. Moreover, the electrical connection between the connection pad 208 of the trench and a corresponding conductive trace 302 of the substrate may for example be formed by soldering.

FIG. 7E illustrates a final step where the fingerprint sensor device 200 is folded over the substrate 300 such that the backside of the device 200 is attached to the substrate 300, for example by means of an adhesive layer 500 arranged therebetween. It is of course also possible to fold the substrate 300 over the fingerprint sensor device 200 to the same effect.

Thereby, the fingerprint sensor module 102 is completed and ready for integration in an electronic device or any other desired application.

Even though the invention has been described with reference to specific exemplifying embodiments thereof, many different alterations, modifications and the like will become apparent for those skilled in the art. Also, it should be noted that parts of the module and method may be omitted, interchanged or arranged in various ways, the module and method yet being able to perform the functionality of the present invention.

Additionally, variations to the disclosed embodiments can be understood and effected by the skilled person in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage.

The invention claimed is:

1. A fingerprint sensor module comprising:
   a rigid fingerprint sensor device comprising a plurality of sensing elements for acquiring an image of a finger placed on a sensing surface of the sensor module, the sensor device comprising at least one trench at an edge of the fingerprint sensor device, the trench comprising electrically conductive connection pads for connecting the sensor device to external circuitry; and
   a substrate comprising an electrically conductive trace and an electric component arranged on the substrate and in electrical contact with the conductive trace, wherein a first side of the substrate is electrically and mechanically connected to the edge trench such that an electrical connection is formed between the sensor device and the electrical component of the substrate via the conductive trace, the substrate comprising a flexible curved portion adjacent to the trench of the fingerprint sensor device, wherein the substrate is bent and folded in under the fingerprint sensor device.

2. The fingerprint sensor module according to claim 1, wherein the trench extends along the entire length of a side on the fingerprint sensor device.

3. The fingerprint sensor module according to claim 1, wherein the trench extends along part of the length of a side on the fingerprint sensor device.

4. The fingerprint sensor module according to claim 1, wherein the electrical component is attached to the side of the substrate which is connected to the trench of the fingerprint sensor device.

5. The fingerprint sensor module according to claim 1, wherein the conductive trace is embedded in the substrate.

6. The fingerprint sensor module according to claim 1, wherein the substrate comprises a plurality of separate embedded conductive layers.

7. The fingerprint sensor module according to claim 1, wherein the conductive trace is arranged on a surface of the substrate.

8. The fingerprint sensor module according to claim 1, wherein the substrate is a flexible substrate.

9. The fingerprint sensor module according to claim 1, wherein a thickness of the substrate is lower than a depth of the trench.

10. The fingerprint sensor module according to claim 1, further comprising a display glass of an electronic device, wherein the fingerprint sensing module is arranged under the display glass such that the display glass forms the sensing surface of the fingerprint sensor device.

11. A method for manufacturing a fingerprint sensor module, the method comprising:
  providing a rigid fingerprint sensor device comprising a plurality of sensing elements for acquiring an image of a finger placed on a sensing surface of the sensor module;
  forming an edge trench in the fingerprint sensor device;
  forming an electrical connection between the sensor surface and the edge trench;
  providing a substrate comprising an electrically conductive trace and an electric component arranged on the substrate and in electrical contact with the conductive trace;
  arranging a first side of the substrate in electrical and mechanical contact with the edge trench to form an electrical connection between the sensor device and the electric component of the substrate; and
  folding a flexible portion of the substrate such that the first side of the substrate makes contact with a side of the fingerprint sensor device opposite the side comprising the plurality of sensing elements.

12. The method according to claim 11, wherein arranging the substrate in contact with the edge trench of the fingerprint sensor device comprises using a flip-chip method wherein the fingerprint sensor device is flipped and placed such that the trench is arranged in contact with the substrate.

13. The method according to claim 11, further comprising:
  providing a carrier comprising a step defining a difference in height between a lower portion and an upper portion of the carrier;
  arranging the substrate on the upper portion of the carrier and adjacent to the step; and
  arranging the sensor device on the lower portion of the carrier and adjacent to the step such that the edge trench is in contact with the substrate and such that at least a portion of the fingerprint sensor device rests on the lower portion of the carrier.

14. A fingerprint sensor module comprising:
  a rigid fingerprint sensor device comprising a plurality of sensing elements for acquiring an image of a finger placed on a sensing surface of the sensor module, the sensor device comprising at least one trench at an edge of the fingerprint sensor device, the trench comprising electrically conductive connection pads for connecting the sensor device to external circuitry; and
  a substrate comprising an electrically conductive trace configured to form an electrical connection between the sensor device and an electric component, wherein a first side of the substrate is electrically and mechanically connected to the edge trench such that an electrical connection can be formed between the sensor device and the electrical component of the substrate via the conductive trace, the substrate comprising a flexible curved portion adjacent to the trench of the fingerprint sensor device, wherein the substrate is bent and folded in under the fingerprint sensor device.

15. The fingerprint sensor module according to claim 14, wherein the fingerprint sensor device is an optical fingerprint sensor device.

16. The fingerprint sensor module according to claim 14, further comprising a display glass of an electronic device, wherein the fingerprint sensing module is arranged under the display glass such that the display glass forms the sensing surface of the fingerprint sensor device.

* * * * *